US012525431B2

(12) United States Patent
Morishita

(10) Patent No.: US 12,525,431 B2
(45) Date of Patent: Jan. 13, 2026

(54) ABERRATION CORRECTOR AND ELECTRON MICROSCOPE

(71) Applicant: JEOL Ltd., Tokyo (JP)

(72) Inventor: Shigeyuki Morishita, Tokyo (JP)

(73) Assignee: JEOL Ltd., Tokyo (JP)

( * ) Notice: Subject to any disclaimer, the term of this patent is extended or adjusted under 35 U.S.C. 154(b) by 464 days.

(21) Appl. No.: 18/107,042

(22) Filed: Feb. 8, 2023

(65) Prior Publication Data

US 2023/0253181 A1 Aug. 10, 2023

(30) Foreign Application Priority Data

Feb. 10, 2022 (JP) ................................ 2022-019349

(51) Int. Cl.
*H01J 37/28* (2006.01)
*H01J 37/153* (2006.01)

(52) U.S. Cl.
CPC ............ *H01J 37/28* (2013.01); *H01J 37/153* (2013.01); *H01J 2237/1532* (2013.01); *H01J 2237/1534* (2013.01)

(58) Field of Classification Search
CPC .. H01J 37/00; H01J 37/02; H01J 37/26; H01J 37/28; H01J 37/153; H01J 2237/1532; H01J 2237/1534
USPC .............................. 250/306, 307, 311, 396 R
See application file for complete search history.

(56) References Cited

U.S. PATENT DOCUMENTS 8,723,134 B2 5/2014 Janzen
2007/0181806 A1* 8/2007 Nakano ................ H01J 37/153 250/310
2011/0114850 A1* 5/2011 Purser .................. H01J 37/153 250/396 R
2011/0114852 A1 5/2011 Henstra
2019/0304739 A1 10/2019 Morishita
2021/0050179 A1* 2/2021 Uhlemann ............ H01J 37/153
2021/0159044 A1* 5/2021 Henstra ................ H01J 37/153

FOREIGN PATENT DOCUMENTS

EP 2325862 A1 5/2011
JP 2011108650 A 6/2011
JP 2019179650 A 10/2019

OTHER PUBLICATIONS

Extended European Search Report issued in EP23154278.8 on Jun. 28, 2023.
Rose H., Outline of a spherically corrected semiaplanatic medium-voltage transmission electron microscope, Optik, vol. 85, No. 1, Wissenschaftliche Verlag GMBH, DE, 1990, pp. 19-24.
Haider et al. , Aberration-Corrected Electron Microscopy, Advances in Imaging and Electron Physics, vol. 153, pp. 41-119.
Office Action issued in JP2022019349 on Feb. 6, 2024.

* cited by examiner

*Primary Examiner* — Jason L Mccormack
(74) *Attorney, Agent, or Firm* — The Webb Law Firm

(57) ABSTRACT

An aberration corrector includes a first multipole element for producing a hexapole field, a second multipole element for producing a hexapole field, and a transfer lens system disposed between the first and second multipole elements. The first and second multipole elements are arranged along an optical axis. At least one of the hexapole fields respectively produced by the first multipole element and the second multipole element varies in strength along the optical axis.

13 Claims, 9 Drawing Sheets

ABERRATION CORRECTOR AND ELECTRON MICROSCOPE

CROSS-REFERENCE TO RELATED APPLICATION

This application claims priority to Japanese Patent Application No. 2022-019349, filed Feb. 10, 2022, the disclosure of which is hereby incorporated by reference in its entirety.

BACKGROUND OF THE INVENTION

1. Field of the Invention

The present invention relates to an aberration corrector and an electron microscope.

2. Description of the Related Art

In an electron microscope such as a transmission electron microscope (TEM) or a scanning electron microscope (SEM), aberration correction is an important technique in acquiring high resolution images.

For example, JP-A-2019-179650 discloses a spherical aberration corrector capable of correcting sixth order three-lobe aberration by producing a four-stage hexapole field.

In an aberration corrector such as disclosed in JP-A-2019-179650, higher-order geometrical aberrations are corrected by increasing the number of stages of multipole elements, in which case, however, the aberration corrector is increased in apparatus size and the height of the body of the electron microscope is also increased.

SUMMARY OF THE INVENTION

One aspect of the aberration corrector associated with the present invention includes a first multipole element for producing a hexapole field, a second multipole element for producing a hexapole field, and a transfer lens system disposed between the first and second multipole elements. The first and second multipole elements are arranged along an optical axis. At least one of the hexapole fields respectively produced by the first multipole element and the second multipole element varies in strength along the optical axis.

In this aberration corrector, sixth order three-lobe aberration can be corrected by causing at least one of the hexapole electric fields respectively produced by the first and second multipole elements to vary along the optical axis. Accordingly, miniaturization of this aberration corrector can be achieved and the height of the electron microscope can be suppressed.

One aspect of the electron microscope associated with the present invention includes the aberration corrector described just above.

DESCRIPTION OF THE INVENTION

Non-limiting embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment

1.1. Aberration Corrector

Figure 1:
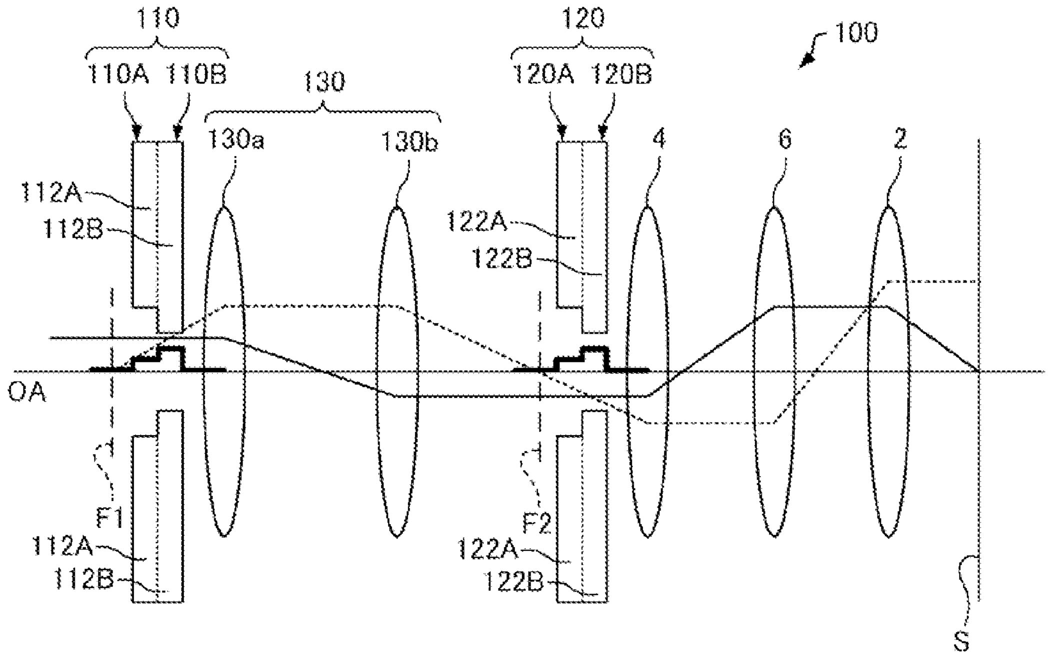
FIG. 1 is a diagram showing the configuration of an aberration corrector associated with a first embodiment of the present invention.

An aberration corrector associated with a first embodiment of the present invention is first described by referring to FIG. 1, which shows the configuration of the aberration corrector, 100, associated with the first embodiment. FIG. 1 shows a case where the aberration corrector 100 is incorporated in the illumination system of an electron microscope. In FIG. 1, an axial trajectory of electron rays (also known as axial rays) is indicated by a solid line, while a field trajectory of electron rays (also known as field rays) is indicated by a broken line. A first multipole element 110 produces a hexapole field. Also, a second multipole element 120 produces a hexapole field. The distributions of the strengths of these hexapole fields taken along their optical axis OA are indicated by bold lines in FIG. 1.

The aberration corrector 100 is incorporated in the illumination system of the electron microscope as stated above, the illumination system being an optical system for irradiating a sample S with an electron beam. The aberration corrector 100 operates to correct spherical aberration in the illumination system. In the illustrated example, transfer lenses 4 and 6 are disposed between the aberration corrector 100 and an objective lens 2.

As also shown in FIG. 1, the aberration corrector 100 includes the first multipole element 110, the second multipole element 120, a transfer lens system 130. The first multipole element 110 and the second multipole element 120 are arranged along the optical axis OA which in turn passes through the centers of the first and second multipole elements 110, 120. The first multipole element 110 and the second multipole element 120 are spaced apart from each other along the optical axis OA. In the aberration corrector 100, the first multipole element 110 and the second multipole element 120 are arranged in this order in the direction of travel of the electron beam.

The first multipole element 110 produces a hexapole field that is either a hexapole magnetic field or a hexapole electric field. A hexapole field is three-fold symmetric. The second multipole element 120 produces a hexapole field which is opposite in polarity to that produced by the first multipole element 110. In the aberration corrector 100, the first multipole element 110 and the second multipole element 120 produce two stages of hexapole fields, thus correcting the spherical aberration in the illumination system.

The first multipole element 110 has a thickness in the direction of travel of the electron beam, i.e., has a thickness along the optical axis OA. The first multipole element 110 produces a negative spherical aberration because aberrations from three-fold astigmatisms in the hexapole field having a thickness combine, resulting in a combination aberration, i.e., a negative spherical aberration. Similarly, the second multipole element 120 has a thickness along the optical axis OA. Aberrations from three-fold astigmatism in the hexapole field having a thickness combine to produce a combination aberration, i.e., a negative spherical aberration.

A combination aberration referred to herein is a combination of aberration 1 and aberration 2 when aberration 1 occurs at some point, propagates a distance to thereby vary the point of incidence, and undergoes the effect of other aberration 2.

In the aberration corrector 100, aberration correction is made utilizing the phenomenon that a hexapole field having a thickness along the optical axis OA produces a negative spherical aberration. In particular, in the aberration corrector 100, two stages of hexapole fields are generated by the first multipole element 110 and the second multipole element 120 to produce a negative spherical aberration. This cancels out the positive spherical aberration in the illumination system. Consequently, the spherical aberration in the illumination system can be corrected.

Figure 2:
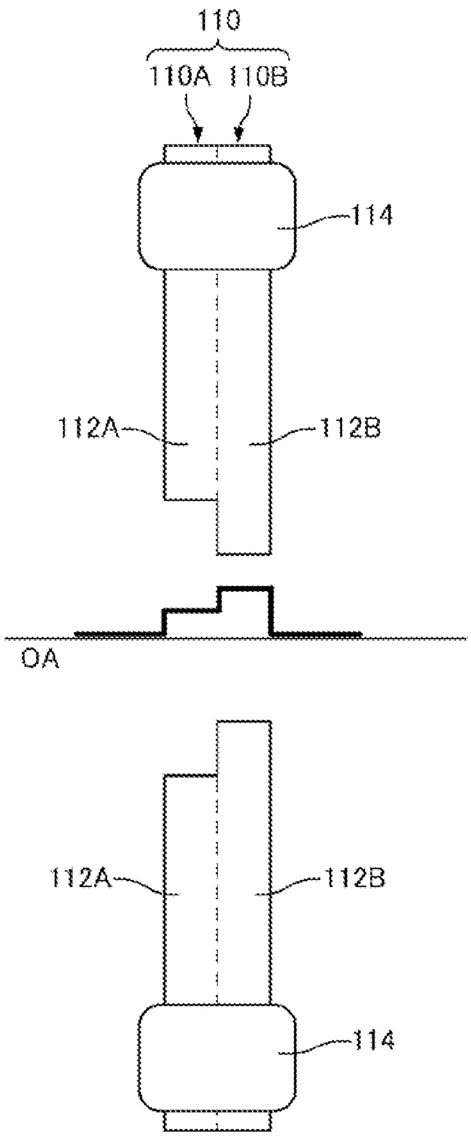
FIG. 2 is a schematic view of a first multipole element.

FIG. 2 schematically shows the first multipole element 110. A distribution of the strength of the hexapole field produced by the first multipole element 110 as taken along the optical axis OA is shown in this figure. As shown, the first multipole element 110 has a first portion 110A and a second portion 110B which are arranged along the optical axis OA. In the illustrated example, the first portion 110A is located ahead of the second portion 110B. That is, an electron beam passes through the first portion 110A and then through the second portion 110B.

Figure 3:
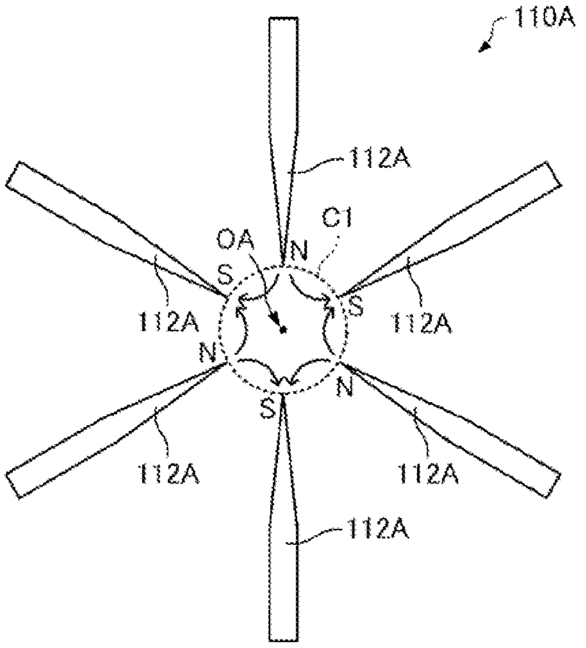
FIG. 3 is a schematic view of a first portion of the first multipole element.
Figure 4:
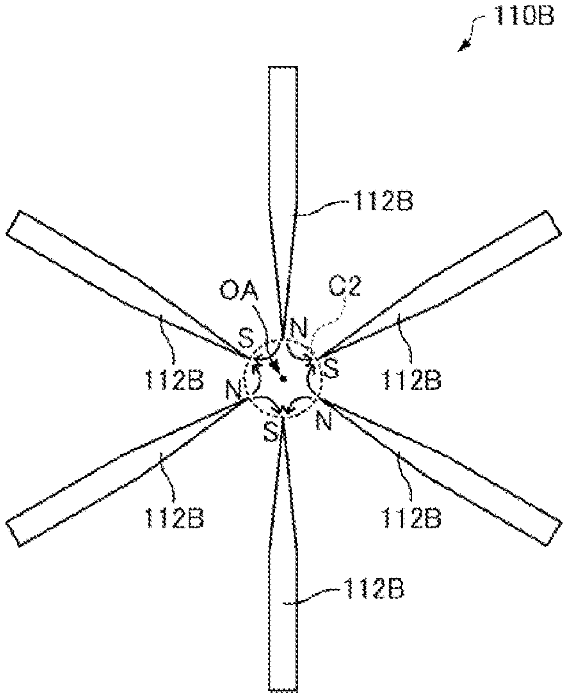
FIG. 4 is a schematic view of a second portion of the first multipole element.

FIG. 3 is a schematic view of the first portion 110A of the first multipole element 110 as viewed along the optical axis OA. FIG. 4 is a schematic view of the second portion 110B of the first multipole element 110 as viewed along the optical axis OA.

The first portion 110A of the first multipole element 110 has a plurality of first polar subelements 112A which are disposed radially. Any adjacent two of the first polar subelements 112 are opposite in polarity. A coil 114 is wound on each first polar subelement 112A. The strength of the magnetic field on the optical axis OA can be varied by controlling the current flowing through the coil 114.

In the illustrated example, there are 6 first polar subelements 112A which together produce a hexapole field. No restriction is placed on the number of polar subelements of the first portion 110A as long as a hexapole field can be generated. The number of polar subelements may also be twelve.

The second portion 110B of the first multipole element 110 has a plurality of second polar subelements 112B which are arranged radially. Any adjacent two of the second polar subelements 112B are opposite in polarity. The coil 114 is also wound on each second polar subelement 112B. The strength of the magnetic field on the optical axis OA can be varied by controlling the current flowing through the coil 114. The coil 114 is common to the first polar subelement 112A and second polar subelement 112B which are juxtaposed along the optical axis OA.

In the illustrated example, there are 6 second polar subelements 112B which together produce a hexapole field. No restriction is placed on the number of polar subelements of the second portion 110B as long as a hexapole field can be generated. The number of polar subelements may also be twelve.

The width of each first polar subelement 112A taken along the optical axis OA and the width of each second polar subelement 112B taken along the optical axis OA are equal to each other, for example. Any adjacent two of the first polar subelements 112A and the second polar subelements 112B which are juxtaposed along the optical axis OA may be in contact or out of contact with each other.

As shown in FIG. 3, the front ends of the first polar subelements 112A are equidistant from the optical axis OA. Therefore, a circle C1 can be formed about the optical axis OA by connecting the front ends of the first polar subelements 112A.

As shown in FIG. 4, the front ends of the second polar subelements 112B are spaced equidistantly from the optical axis OA and, therefore, a circle C2 can be formed about the optical axis OA by connecting the front ends of the second polar subelements 112B.

The circle C1 connecting the front ends of the first polar subelements 112A and the circle C2 connecting the front ends of the second polar subelements 112B are different in diameter and so the hexapole field produced by the first multipole element 110 varies in strength along the optical axis OA. With respect to the strength distribution in the hexapole field produced by the first multipole element 110 as taken along the optical axis OA, the strength varies across the center of the first multipole element 110 that lies at the boundary between any adjacent two of the first polar subelements 112A and the second polar subelements 112B.

In the illustrated example, the circle C1 is greater in diameter than the circle C2. Therefore, the hexapole field produced on the optical axis OA by the second portion 110B is stronger than the hexapole field produced on the optical axis OA by the first portion 110A. The strength distribution in the hexapole field produced by the first multipole element 110 as taken along the optical axis OA is asymmetrical with respect to an axis which passes through the center of the first multipole element 110 and which is orthogonal to the optical axis OA.

As described previously, the first multipole element 110 produces a hexapole field whose strength varies along the optical axis OA by having the first portion 110A and the second portion 110B but the hexapole field in the first multipole element 110 does not vary in sense. In the hexapole field generated by the first multipole element 110, the secondary and higher order trajectories of electron rays vary but the primary trajectory does not.

In the example shown in FIG. 2, any adjacent two of the first polar subelements 112A and the second polar subelements 112B together constitute one polar subassembly on which the coil 114 is wound. That is, the coil for producing a magnetic field is common to these first polar subelement 112A and second polar subelement 112*b*. Alternatively, coils may be respectively wound on these first polar subelement 112A and second polar subelement 112B and these polar subelements may be placed close to each other along the optical axis OA in a manner not illustrated. In this case, the strength of the hexapole field can be varied along the optical axis OA in the same manner as in the example illustrated in FIG. 2.

The second multipole element 120 is configured similarly to the first multipole element 110 shown in FIGS. 2-4. That is, the second multipole element 120 has a first portion 120A and a second portion 120B arranged along the optical axis OA in the same manner as the first multipole element 110. The first portion 120A has a plurality of first polar subelements 122A. The second portion 120B has a plurality of second polar subelements 122B. A circle formed by connecting the front ends of the first polar subelements 122A is greater in diameter than a circle formed by connecting the front ends of the second polar subelements 122B.

The strength distribution in the hexapole field produced by the second multipole element 120 is similar to that in the hexapole field produced by the first multipole element 110 as shown in FIG. 1. The hexapole field produced on the optical axis OA by the second portion 120B is stronger than the hexapole field produced on the optical axis OA by the first portion 120A. The strength distribution in the hexapole field produced by the second multipole element 120 as taken along the optical axis OA is asymmetrical. In the hexapole field produced by the second multipole element 120, the primary trajectory does not vary.

The transfer lens system 130 includes a plurality of lenses (a first lens 130*a* and a second lens 130*b* in the illustrated example) and transfers an image of a first plane F1 onto a second plane F2. That is, the transfer lens system 130 makes the first plane F1 and the second plane F2 conjugate to each other. The first plane F1 deviates from the center of the first multipole element 110. The second plane F2 deviates from the center of the second multipole element 120.

In this way, in the aberration corrector 100, the first plane F1 deviating from the center of the hexapole field produced by the first multipole element 110 is transferred to the second plane F2 deviating from the center of the hexapole field produced by the second multipole element 120. That is, the transfer lens system 130 does not transfer the center of the hexapole field produced by the first multipole element 110 to the center of the hexapole field produced by the second multipole element 120.

In the illustrated example, the first plane F1 is located ahead of the first multipole element 110 in the direction along the optical axis OA, while the second plate F2 is positioned ahead of the second multipole element 120 and between the first multipole element 110 and the second multipole element 120.

1.2. Operation

Figure 5:
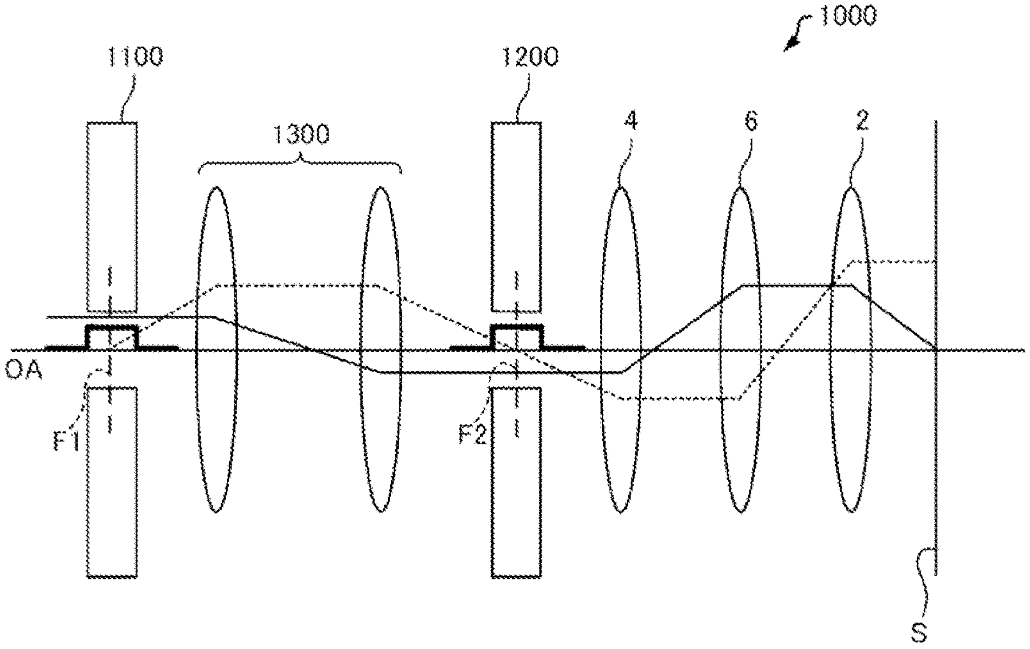
FIG. 5 is a diagram of an aberration corrector of a comparative example.

The operation of the aberration corrector 100 is next described. FIG. 5 shows an aberration corrector 1000 of a comparative example. The aberration corrector 1000 is a spherical aberration corrector of a two stage, hexapole field type. A first multipole element 1100 produces a hexapole field in which the strength distribution along the optical axis OA is uniform. A second multipole element 1200 produces a hexapole field in which the strength distribution along the optical axis OA is similarly uniform.

In the following description, the operation of the aberration corrector 100 is compared with the operation of the aberration corrector 1000 of the comparative example.

<Spherical Aberration>

In the aberration corrector 1000, the first multipole element 1100 and the second multipole element 1200 produce a negative spherical aberration as a combination aberration of three-fold astigmatisms in a hexapole field having a thickness. Accordingly, in the aberration corrector 1000, a positive spherical aberration in the illumination system is canceled out by producing the negative spherical aberration by means of the first multipole element 1100 and the second multipole element 1200. Consequently, spherical aberration in the illumination system can be corrected.

In the inventive aberration corrector 100, the first multipole element 110 and the second multipole element 120 produce a negative spherical aberration as a combination aberration of three-fold astigmatisms in a hexapole field having a thickness in the same manner as the aberration corrector 1000. Therefore, the aberration corrector 100 can correct spherical aberration in the illumination system in the same manner as the aberration corrector 1000.

<Fourth-Order Three-Lobe Aberration>

In the aberration corrector 1000, a transfer lens system 1300 transfers an image of a first plane F1 located at the center of a hexapole field produced by the first multipole element 1100 to a second plane F2 located at the center of a hexapole field produced by the second multipole element 1200.

On the other hand, in the inventive aberration corrector 100, the transfer lens system 130 transfers an image of the first plane F1 deviating from the center of the first multipole element 110 to the second plane F2 deviating from the center of the second multipole element 120. In the aberration corrector 100, fourth-order three-lobe aberration can be corrected by deviating the first plane F1 from the center of the first multipole element 110, deviating the second plane F2 from the center of the second multipole element 120, and adjusting the distance of transfer as taken from the first plane F1 to the second plane F2.

<Sixth-Order Three-Lobe Aberration>

In the aberration corrector 1000 of the comparative example, six-fold astigmatism and sixth-order three-lobe aberration will be left behind. The six-fold astigmatism can be corrected by adjusting the thickness of the first multipole element 1100 and the thickness of the second multipole element 1200. However, the aberration corrector 1000 is unable to correct sixth-order three-lobe aberration.

In contrast, in the aberration corrector 100, sixth-order three-lobe aberration is corrected by causing each of the first multipole element 110 and the second multipole element 120 to produce a respective hexapole field whose strength varies along the optical axis OA.

In the aberration corrector 1000 of the comparative example, the first multipole element 1100 produces a hexapole field whose strength is constant along the optical axis OA. Therefore, the strength distribution along the optical axis OA of the hexapole field produced by the first multipole element 1100 is symmetrical with respect to an axis which passes through the center of the first multipole element 1100 and which is perpendicular to the optical axis OA. Similarly, the second multipole element 120 produces a hexapole field whose strength is constant along the optical axis OA. The distribution of the strength of this hexapole field as taken along the optical axis OA is symmetrical.

In contrast, in the aberration corrector 100, the first multipole element 110 produces a hexapole field whose strength varies along the optical axis OA. The distribution of the strength of this hexapole field is asymmetrical with respect to an axis which passes through the center of the first multipole element 110 and which is perpendicular to the optical axis OA. Similarly, the second multipole element 120 produces a hexapole field whose strength varies along the optical axis OA. The distribution of the strength of this hexapole field taken along the optical axis OA is asymmetrical.

Sixth-order three-lobe aberration occurs as a combination aberration from spherical aberrations of the fifth or lower orders (third-order spherical aberration and fifth-order spherical aberration) and from three-fold symmetric aberration of the fifth or lower orders (fourth-order three-lobe aberration and three-fold astigmatism). A combination aberration is caused by introduction of aberrations from optically different planes. Therefore, in the aberration corrector 100, sixth-order three-lobe aberration is controlled and corrected by modulating the strength of the hexapole field and controlling the positions of aberrations (i.e., the position of the plane to which aberrations are introduced) which cause the sixth-order three-lobe aberration.

In this way, in the aberration corrector 100, sixth-order three-lobe aberration is corrected by varying the strength of the hexapole field produced by the first multipole element 110 as taken along the optical axis OA and varying the strength of the hexapole field produced by the second multipole element 120 as taken along the optical axis OA.

<Six-Fold Astigmatism>

As described previously, in the aberration corrector 1000 of the comparative example, six-fold astigmatism remains but it can be corrected by adjusting the thicknesses of the first multipole element 1100 and second multipole element 1200.

In contrast, in the aberration corrector 100, six-fold astigmatism is corrected by varying the strength of the hexapole field produced by the first multipole element 110 as taken along the optical axis OA and varying the strength of the hexapole field produced by the second multipole element 120 as taken along the optical axis OA.

Six-fold astigmatism occurs as a combination aberration of three-fold astigmatism and fourth-order three-lobe aberration. Accordingly, in the aberration corrector 100, six-fold astigmatism is controlled and corrected by modulating the strength of the hexapole field and controlling the positions of aberrations causing the six-fold astigmatism in the same manner as the correction of six-fold three-lobe aberration.

1.3. Advantageous Effects

The aberration corrector 100 includes the first multipole element 110 for producing a hexapole field, the second multipole element 120 for producing a hexapole field, and a transfer lens system 130 disposed between the first multipole element 110 and the second multipole element 120. The first multipole element 110 and the second multipole element 120 are arranged along the optical axis OA. The strength of the hexapole field produced by the first multipole element 110 varies along the optical axis OA. Similarly, the strength of the hexapole field produced by the second multipole element 120 varies along the optical axis OA.

In the aberration corrector 100, sixth-order three-lobe aberration can be corrected by causing the strength of the hexapole field produced by the first multipole element 110 to vary along the optical axis OA and causing the strength of the hexapole field produced by the second multipole element 120 to vary along the optical axis OA.

Furthermore, in the aberration corrector 100, six-fold astigmatism can be corrected by causing the strength of the hexapole field produced by the first multipole element 110 to vary along the optical axis OA and causing the strength of the hexapole field produced by the second multipole element 120 to vary along the optical axis OA.

In this way, in the aberration corrector 100, higher order geometric aberrations can be corrected by means of two stages of multipole elements, i.e., the first multipole element 110 and the second multipole element 120. Accordingly, miniaturization of the aberration corrector 100 can be accomplished. Also, the height of the electron microscope can be suppressed.

In the aberration corrector 100, the distribution of the strength of the hexapole field produced by the first multipole element 110 as taken along the optical axis OA is asymmetrical. Also, the distribution of the strength of the hexapole field produced by the second multipole element 120 as taken along the optical axis OA is asymmetrical. Therefore, the aberration corrector 100 can correct sixth-order three-lobe aberration. Furthermore, the aberration corrector 100 can correct six-fold astigmatism.

In the aberration corrector 100, the transfer lens system 130 transfers an image of the first plane F1 deviating from the center of the first multipole element 110 to the second plane F2 deviating from the center of the second multipole element 120. Therefore, the aberration corrector 100 can correct fourth-order three-lobe aberration.

In the aberration corrector 100, the first multipole element 110 and the second multipole element 120 do not vary the primary trajectory of electron rays. In this way, the aberration corrector 100 can correct higher order geometric aberrations without varying the primary trajectory of electron rays.

In the aberration corrector 100, the first multipole element 110 has the first portion 110A and the second portion 110B arranged along the optical axis OA. The first portion 110A has the plurality of first polar subelements 112A. Similarly, the second portion 110B has the plurality of second polar subelements 112B. The circle C1 connecting the front ends of the first polar subelements 112A and the circle C2 connecting the front ends of the second polar subelements 112B are different in diameter. Therefore, in the aberration corrector 100, the first multipole element 110 can produce a hexapole field whose strength varies along the optical axis OA.

In the aberration corrector 100, the second multipole element 120 has the first portion 120A and the second portion 120B arranged along the optical axis OA. The first portion 120A has the plurality of polar subelements 122A. Similarly, the second portion 120B has the plurality of polar subelements 122B. The circle connecting the front ends of the first polar subelements 122A and the circle connecting the front ends of the second polar subelements 122B are different in diameter. Therefore, in the aberration corrector 100, the second multipole element 120 can produce a hexapole field whose strength varies along the optical axis OA.

2. Second Embodiment

Figure 6:
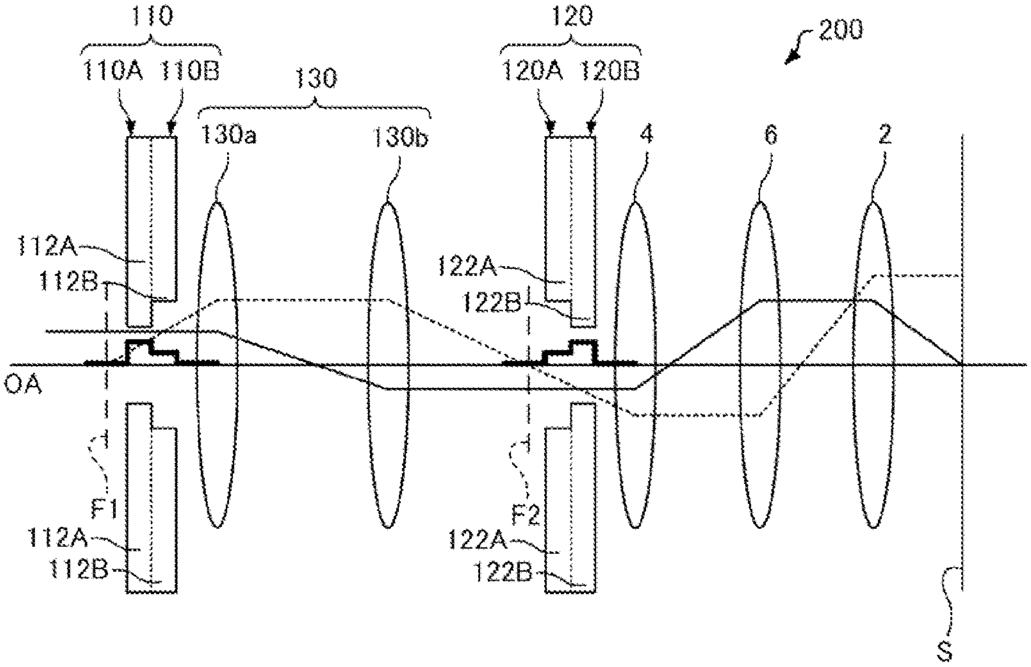
FIG. 6 is a diagram showing the configuration of an aberration corrector associated with a second embodiment.

An aberration corrector associated with a second embodiment is next described by referring to FIG. 6, which shows the configuration of the aberration corrector, 200, associated with the second embodiment. In the ensuing description, those members of the aberration corrector 200 which are similar in function to their counterparts of the aberration corrector 100 associated with the first embodiment are indicated by the same reference numerals as in the foregoing figures and a detailed description thereof is omitted.

In the above-stated aberration corrector 100, as shown in FIGS. 1-4, the hexapole field produced on the optical axis OA by the second portion 110B of the first multipole element 110 is stronger than the hexapole field produced on the optical axis OA by the first portion 110A of the first multipole element 110. The hexapole field produced on the optical axis OA by the second portion 120B of the second multipole element 120 is stronger than the hexapole field produced on the optical axis OA by the first portion 120A. Consequently, the aberration corrector 100 can correct sixth-order three-lobe aberration.

On the other hand, in the aberration corrector 200, as shown in FIG. 6, the hexapole field produced on the optical axis OA by the first portion 110A of the first multipole element 110 is stronger than the hexapole field produced on the optical axis OA by the second portion 110B of the first multipole element 110. The hexapole field produced on the optical axis OA by the second portion 120B of the second multipole element 120 is stronger than the hexapole field produced on the optical axis OA by the first portion 120A. Consequently, the aberration corrector 200 can correct sixth-order three-lobe aberration and six-fold astigmatism in the same manner as the aberration corrector 100. Furthermore, the aberration corrector 200 can correct various geometric aberrations in the same manner as the aberration corrector 100.

3. Third Embodiment

Figure 7:
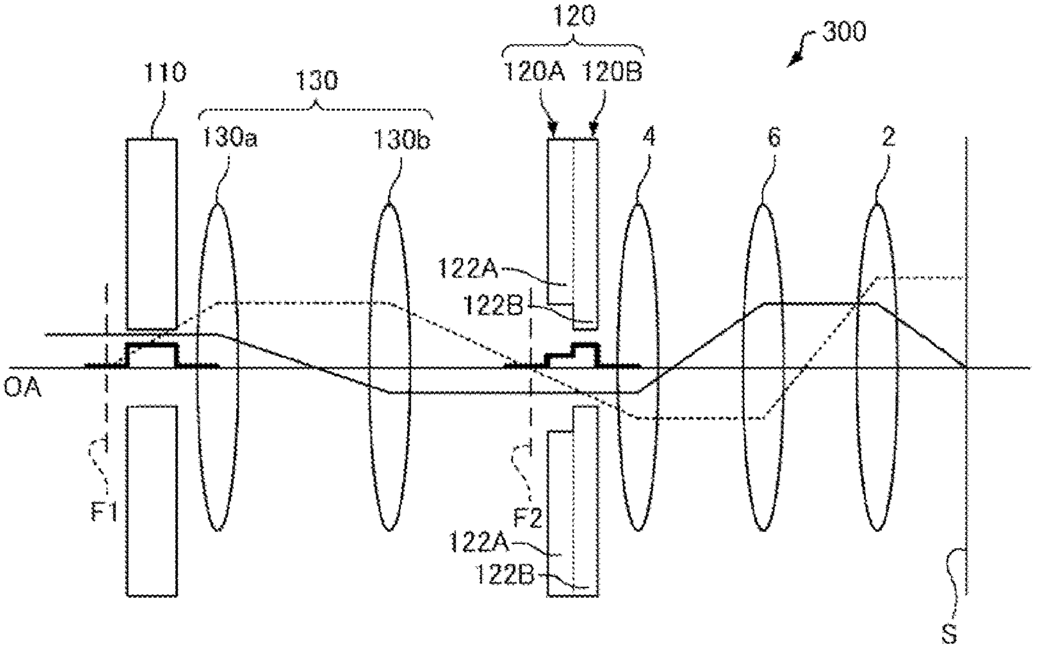
FIG. 7 is a diagram showing the configuration of an aberration corrector associated with a third embodiment.

An aberration corrector associated with a third embodiment is next described by referring to FIG. 7, which shows the configuration of the aberration corrector, 300, associated with the third embodiment. In the description that follows, those members of the aberration corrector 300 which are similar in function to their counterparts of the aberration corrector 100 associated with the first embodiment are indicated by the same reference numerals as in the foregoing figures and a detailed description thereof is omitted.

In the above-stated aberration corrector 100, as shown in FIGS. 1-4, each of the first multipole element 110 and the second multipole element 120 produces a respective hexapole field whose strength varies along the optical axis OA.

On the other hand, in the aberration corrector 300, as shown in FIG. 7, the first multipole element 110 produces a hexapole field whose strength is constant along the optical axis, while the second multipole element 120 produces a hexapole field whose strength varies along the optical axis OA.

In the aberration corrector 300, the hexapole field produced by the first multipole element 110 is symmetrical with respect to an axis which passes through the center of the first multipole element 110 and which is perpendicular to the optical axis OA. The front ends of the polar subelements of the first multipole element 110 are equidistant from the optical axis OA.

In the aberration corrector 300, the second multipole element 120 produces a hexapole field whose strength varies along the optical axis OA and thus the aberration corrector 300 can correct sixth-order three-lobe aberration and six-fold astigmatism in the same manner as the aberration corrector 100. Furthermore, the aberration corrector 300 can correct various geometric aberrations in the same manner as the aberration corrector 100.

4. Fourth Embodiment

Figure 8:
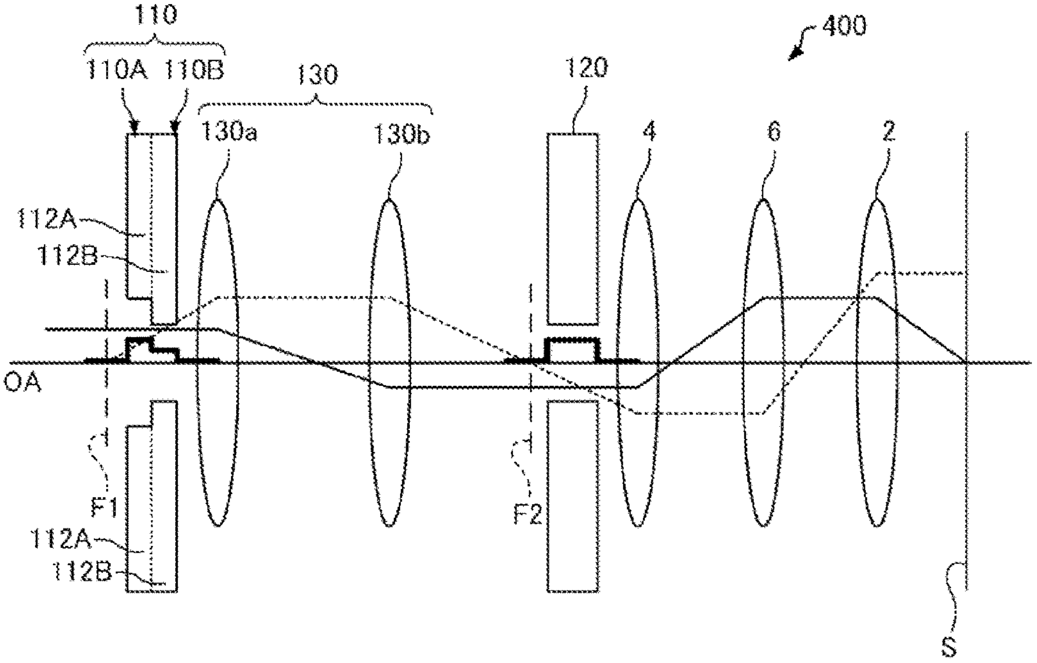
FIG. 8 is a diagram showing the configuration of an aberration corrector associated with a fourth embodiment.

An aberration corrector associated with a fourth embodiment is next described by referring to FIG. 8, which shows the configuration of the aberration corrector, 400, associated with the fourth embodiment. In the following description, those members of the aberration corrector 400 which are similar in function to their counterparts of the aberration corrector 100 associated with the first embodiment are indicated by the same reference numerals as in the foregoing figures and a detailed description thereof is omitted.

In the above-stated aberration corrector 100, as shown in FIGS. 1-4, each of the first multipole element 110 and the second multipole element 120 produces a respective hexapole field whose strength varies along the optical axis OA.

On the other hand, in the aberration corrector 400, as shown in FIG. 8, the first multipole element 110 produces a hexapole field whose strength varies along the optical axis OA, while the second multipole element 120 produces a hexapole field whose strength is constant along the optical axis OA.

In the aberration corrector 400, the hexapole field produced by the second multipole element 120 is symmetrical with respect to an axis which passes through the center of the second multipole element 120 and which is perpendicular to the optical axis OA. The front ends of the polar subelements of the second multipole element 120 are equidistant from the optical axis OA.

In the aberration corrector 400, the first multipole element 110 produces a hexapole field whose strength varies along the optical axis OA and, therefore, the aberration corrector 400 can correct sixth-order three-lobe aberration and six-fold astigmatism in the same manner as the aberration corrector 100. Furthermore, the aberration corrector 400 can correct various geometric aberrations in the same manner as the aberration corrector 100.

5. Fifth Embodiment

Figure 9:
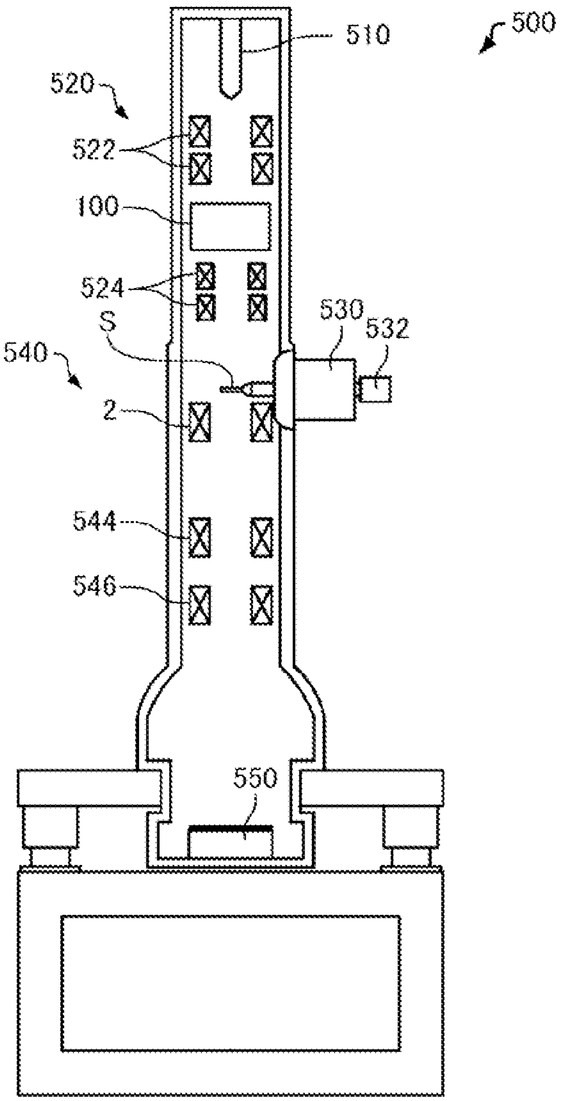
FIG. 9 is a diagram showing the configuration of an electron microscope associated with a fifth embodiment.

An electron microscope associated with a fifth embodiment is next described by referring to FIG. 9, which shows the configuration of the electron microscope, 500, associated with the fifth embodiment.

The electron microscope 500 includes the aberration corrector 100. The electron microscope 500 is a scanning transmission electron microscope having an illumination system 520 in which the aberration corrector 100 is incorporated. As shown in FIG. 9, the electron microscope 500 includes an electron source 510, the illumination system 520, a sample stage 530, an imaging system 540, and a detector 550.

The electron source 510 emits an electron beam. For example, the electron source 510 is an electron gun in which electrons emitted from a cathode are accelerated by an anode and released as the electron beam.

The illumination system 520 focuses the electron beam released from the electron source 510 into an electron probe and scans a sample S with the electron probe. The illumination system 520 includes condenser lenses 522 and a beam deflector 524.

The condenser lenses 522 focus the electron beam released from the electron source 510 into the electron probe. An objective lens 2 produces a magnetic field ahead of the sample S. The magnetic field serves as a magnetic lens and cooperates with the condenser lenses 522 to form the electron probe.

The beam deflector 524 deflects the focused electron beam in two dimensions. The sample S can be scanned with the electron probe by deflecting the electron beam with the beam deflector 524. The illumination system 520 may include lenses other than the condenser lenses 522, apertures, and so on (not shown).

The aberration corrector 100 is incorporated in the illumination system 520 and operates to correct aberrations in the illumination system, especially in the condenser lenses 522. As shown in FIG. 1, the transfer lenses 4 and 6 are disposed between the aberration corrector 100 and the objective lens 2. The sample stage 530 supports the sample S that is held in a sample holder 532. The sample stage 530 permits the sample S to be placed in position.

The imaging system 540 is an optical system for imaging the sample S with the electron beam transmitted through the sample S. The electron beam transmitted through the sample S is directed to the detector 550 by the imaging system 540. The imaging system 540 includes the objective lens 2, an intermediate lens 544, and a projector lens 546.

The detector 550 may be, for example, either a dark field STEM detector for detecting electrons non-elastically scattered at high angles from the sample S by means of an annular detector or a bright field STEM detector for detecting transmitted waves exiting in the same direction as the incident electron beam after being transmitted through the sample S.

In the electron microscope 500, the electron beam released from the electron source 510 is focused into an electron probe by the illumination system 520. The electron probe is scanned in two dimensions by the beam deflector 524. Consequently, the sample S can be scanned with the electron probe. The electron beam transmitted through the sample S is directed to the detector 550 by the imaging system 540 and detected by the detector 550. For example, an STEM (scanning transmission electron microscopy) image can be obtained by detecting the electrons transmitted through the sample S with the detector 550 in synchronism with the scanning with the electron probe. Since the electron microscope 500 includes the aberration corrector 100, it is possible to produce high resolution STEM images.

6. Sixth Embodiment

Figure 10:
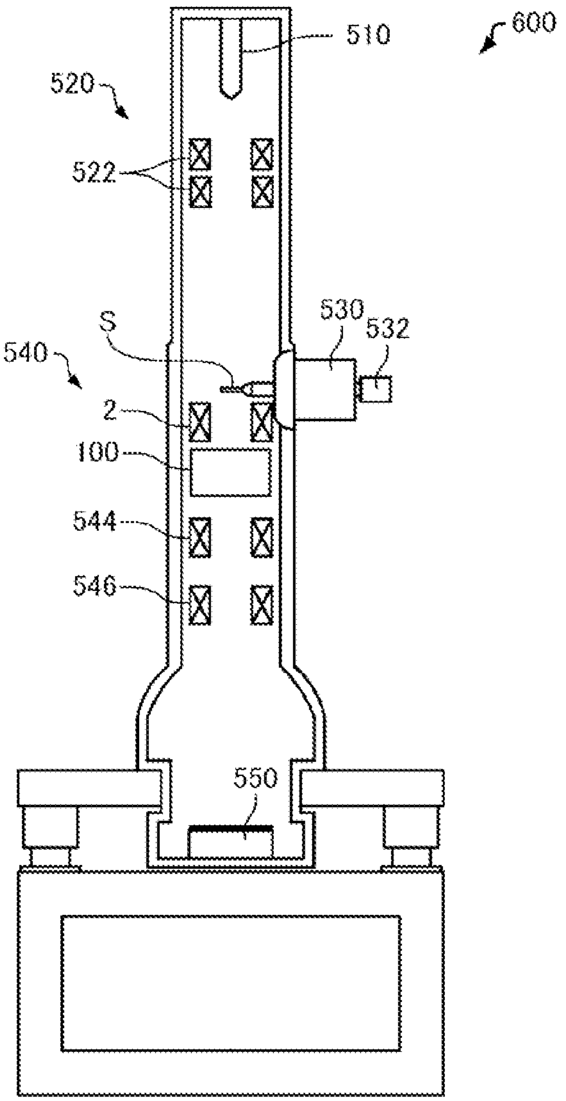
FIG. 10 is a diagram showing the configuration of an electron microscope associated with a sixth embodiment.

An electron microscope associated with a sixth embodiment is next described by referring to FIG. 10, which shows the configuration of the electron microscope, 600, associated with the sixth embodiment. In the following description, those members of the electron microscope 600 which are similar in function to their counterparts of the electron microscope 500 associated with the fifth embodiment are indicated by the same reference numerals as in the foregoing figures and a detailed description thereof is omitted.

The above-stated electron microscope 500 shown in FIG. 9 is a scanning transmission electron microscope having the illumination system 520 incorporating the aberration corrector 100. The electron microscope 600 is a transmission electron microscope (TEM) having the aberration corrector 100 incorporated in the imaging system 540 as shown in FIG. 10.

The illumination system 520 illuminates the sample S with the electron beam emitted from the electron source 510. For example, the illumination system 520 directs a collimated beam at a region to be observed.

The objective lens 2 is a first stage of lens for creating a focused TEM image from the electron beam transmitted through the sample S. The image focused by the objective lens 2 is further magnified by the intermediate lens 544 and the projector lens 546 and focused onto the detector 550.

The aberration corrector 100 is incorporated in the imaging system 540 and operates to correct aberrations in the imaging system 540, especially aberrations in the objective lens 2. The detector 550 detects electrons transmitted through the sample S and captures the image focused by the imaging system 540. The detector 550 is a digital camera such as a CCD (charge-coupled device) camera, for example.

In the electron microscope 600, the electron beam released from the electron source 510 is focused by the illumination system 520 and made to impinge on the sample S. A collimated beam, for example, is made to impinge on the region of the sample S to be observed. A TEM image is created from the electron beam transmitted through the sample S by the imaging system 540 and captured by the detector 550. In the electron microscope 600, aberrations in the imaging system 540 can be corrected by the aberration corrector 100 and so the microscope 600 can produce high resolution TEM images.

7. Modified Embodiments

It is to be understood that the present invention is not restricted to the foregoing embodiments and that various modified embodiments can be implemented without departing from the gist of the present invention.

Figure 11:
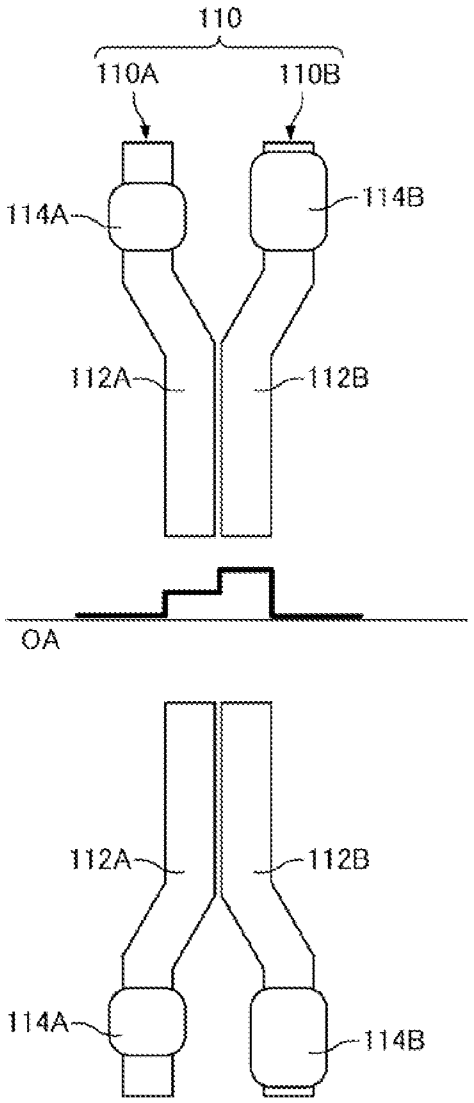
FIG. 11 is a schematic view of a modification of the first multipole element.

FIG. 11 shows a modification of the first multipole element 110. In the above-stated first embodiment, as shown in FIG. 2, the circle C1 connecting the front ends of the first polar subelements 112A and the circle C2 connecting the front ends of the second polar subelements 112B are made different in diameter to cause the first multipole element 110 to produce a hexapole field whose strength varies along the optical axis OA. In contrast, as shown in FIG. 11, the first portion 110A includes the plural first polar subelements 112A and first coils 114A wound on the first polar subelements 112A, respectively. Similarly, the second portion 110B includes the plural second polar subelements 112B and second coils 114B wound on the second polar subelements 112B, respectively.

Each second coil 114B is different in number of turns from each first coil 114A. Consequently, the strength of the hexapole field along the optical axis OA can be varied by the first multipole element 110. In the illustrated example, the number of turns of each second coil 114B is greater than that of each first coil 114A. Therefore, the hexapole field produced on the optical axis OA by the second portion 110B is greater in strength than the hexapole field produced on the optical axis OA by the first portion 110A.

The first multipole element 110 is allowed to produce a hexapole field whose strength varies along the optical axis OA by setting the first coils 114A and the second coils 114B in terms of number of turns in this way.

Figure 12:
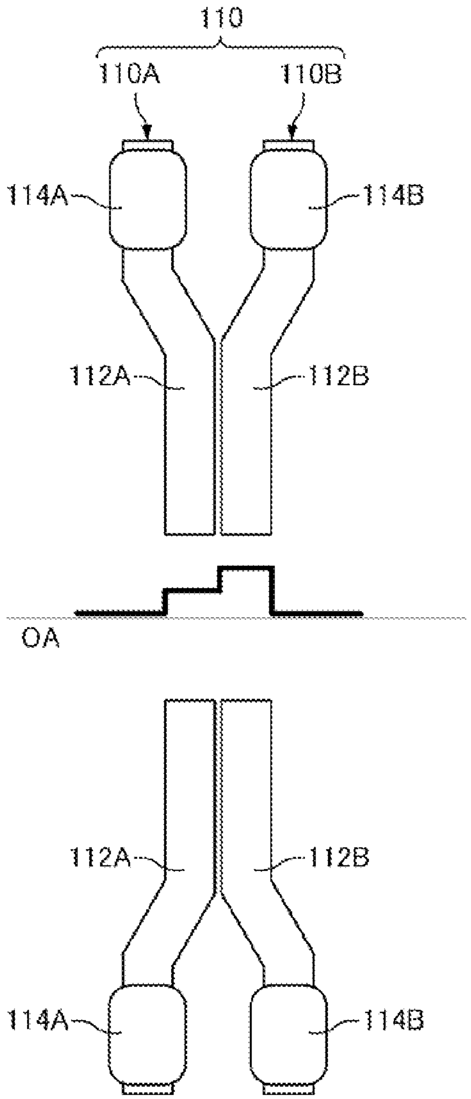
FIG. 12 is a schematic view of another modification of the first multipole element.

FIG. 12 shows another modification of the first multipole element 110. As shown, in this first multipole element 110, the first polar subelements 112A and the second polar subelements 112B are equidistantly spaced from the optical axis OA, and the first coils 114A and the second coils 114B are made equal in number of turns. The first multipole element 110 can be made to produce a hexapole field whose strength varies along the optical axis OA by controlling the amount of current flowing through the first coils 114A and the amount of current flowing through the second coils 114B.

In the illustrated example, the amount of current flowing through the second coils 114B is greater than the amount of current flowing through the first coils 114A. Accordingly, as shown in FIG. 10, the hexapole field produced on the optical axis OA by the second portion 110B can be made greater in strength than the hexapole field produced on the optical axis OA by the first portion 110A.

In the first portion 110A and the second portion 110B of the first multipole element 110, a hexapole field whose strength varies along the optical axis OA may be produced by the first multipole element 110 according to a combination of the diameters of the circles connecting the front ends of plural polar subelements, the numbers of turns of coils, and the amounts of current flowing into the coils.

Similarly, the second multipole element 120 can produce a hexapole field whose strength varies along the optical axis OA by a technique similar to the above-described technique applied to the above-stated first multipole element 110.

It is to be understood that the present invention is not restricted to the foregoing embodiments and that the invention may be practiced in variously modified forms. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. An aberration corrector comprising:

a first multipole element for producing a hexapole field;

a second multipole element for producing a hexapole field; and a transfer lens system disposed between the first and second multipole elements;

wherein the first and second multipole elements are arranged along an optical axis; and wherein at least one of the hexapole fields respectively produced by the first multipole element and the second multipole element varies in strength along the optical axis.

2. The aberration corrector as set forth in claim 1, wherein at least one of the hexapole fields respectively produced by said first multipole element and said second multipole element is varied in strength along said optical axis, thus correcting sixth-order three-lobe aberration.

3. The aberration corrector as set forth in claim 1, wherein the hexapole field produced by said first multipole element varies in strength along said optical axis, and wherein the hexapole field produced by the first multipole element has an asymmetrical strength distribution as taken along the optical axis.

4. The aberration corrector as set forth in claim 3, wherein the hexapole field produced by said second multipole element varies in strength along said optical axis, and wherein the hexapole field produced by the second multipole element has an asymmetrical strength distribution as taken along the optical axis.

5. The aberration corrector as set forth in claim 1, wherein said transfer lens system transfers an image of a first plane deviating from the center of said first multipole element to a second plane deviating from the center of said second multipole element.

6. The aberration corrector as set forth in claim 5, wherein said transfer lens system transfers the image of said first plane to said second plane to thereby correct fourth-order three-lobe aberration.

7. The aberration corrector as set forth in claim 1, wherein neither said first multipole element nor said second multipole element varies a primary trajectory of electron rays.

8. The aberration corrector as set forth in claim 1, wherein said first multipole element has a first portion and a second portion arranged along said optical axis, the first portion having a plurality of first polar subelements, the second portion having a plurality of second polar subelements, and wherein a circle connecting front ends of the first polar subelements and a circle connecting front ends of the second polar subelements are different in diameter.

9. The aberration corrector as set forth in claim 1, wherein said first multipole element has a first portion and a second portion arranged along said optical axis, the first portion having a plurality of first polar subelements and first coils respectively wound on the first polar subelements, the second portion having a plurality of second polar subelements and second coils respectively wound on the second polar subelements, and wherein each of the second coils is different in number of turns from each of the first coils.

10. The aberration corrector as set forth in claim 1, wherein said first multipole element has a first portion and a second portion arranged along said optical axis, the first portion having a plurality of first polar subelements and first coils respectively wound on the first polar subelements, the second portion having a plurality of second polar subelements and second coils respectively wound on the second polar subelements, and wherein each of the second coils is supplied with an amount of current different from an amount of current supplied to each of the first coils.

11. An electron microscope comprising an aberration corrector as set forth in claim 1.

12. An aberration corrector comprising:

a first multipole element for producing a hexapole field;

a second multipole element for producing a hexapole field; and a transfer lens system disposed between the first and second multipole elements;

wherein the first and second multipole elements are arranged along an optical axis; and wherein at least one of the hexapole fields respectively produced by the first multipole element and the second multipole element varies in strength along the optical axis,; and wherein the hexapole field produced by said first multipole element varies in strength along said optical axis, and wherein the hexapole field produced by the first multipole element has an asymmetrical strength distribution as taken along the optical axis.

13. An aberration corrector comprising:

a first multipole element for producing a hexapole field;

a second multipole element for producing a hexapole field; and a transfer lens system disposed between the first and second multipole elements;

wherein the first and second multipole elements are arranged along an optical axis; and wherein at least one of the hexapole fields respectively produced by the first multipole element and the second multipole element varies in strength along the optical axis; and wherein said first multipole element has a first portion and a second portion arranged along said optical axis, the first portion having a plurality of first polar subelements, the second portion having a plurality of second polar subelements, and wherein a circle connecting front ends of the first polar subelements and a circle connecting front ends of the second polar subelements are different in diameter.

* * * * *